(12) United States Patent
Blondin et al.

(10) Patent No.: US 7,026,806 B2
(45) Date of Patent: Apr. 11, 2006

(54) APPARATUS FOR PREVENTING CROSS TALK AND INTERFERENCE IN SEMICONDUCTOR DEVICES DURING TEST

(75) Inventors: John M. Blondin, Colchester, VT (US); Gene T. Patrick, Richmond, VT (US); Kevin M. Potasiewicz, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/604,183

(22) Filed: Jun. 30, 2003

(65) Prior Publication Data

US 2004/0262603 A1 Dec. 30, 2004

(51) Int. Cl.
*G01R 31/00* (2006.01)
(52) U.S. Cl. .................................. 324/158.1; 324/765
(58) Field of Classification Search ............. 324/73.1, 324/158.1, 754–762; 439/482
See application file for complete search history.

(56) References Cited

U.S. PATENT DOCUMENTS

| 5,266,889 | A | * | 11/1993 | Harwood et al. | ............ 324/754 |
| 5,986,447 | A | * | 11/1999 | Hanners et al. | .......... 324/158.1 |
| 6,104,204 | A | * | 8/2000 | Hayama et al. | ............. 324/760 |

* cited by examiner

Primary Examiner—Vinh P. Nguyen
(74) Attorney, Agent, or Firm—Francis J. Thornton

(57) ABSTRACT

An apparatus and a method for testing semiconductor devices such as integrated circuits having a handler for picking up an integrated circuit to be tested and placing the picked up integrated circuit into an automatic circuit test apparatus. When the circuit to be tested is inserted into the test apparatus an extraneous signal shield is automatically engaged to enclose the device being tested and protect the circuit, being tested, from stray extraneous electromagnetic signals during the test thereby preventing said stray electromagnetic interference from inducing errors in the tested circuit.

15 Claims, 6 Drawing Sheets

APPARATUS FOR PREVENTING CROSS TALK AND INTERFERENCE IN SEMICONDUCTOR DEVICES DURING TEST

BACKGROUND OF INVENTION

1. Field of the Invention

The present invention relates generally to an apparatus and a method for testing semiconductor devices such as integrated circuits. More particularly, the present invention is directed to a handler for placing an integrated circuit to be tested into an automatic circuit test apparatus while simultaneously protecting the circuit, being tested, from stray extraneous electromagnetic signals during the test thus preventing cross talk and other electromagnetic interference from inducing errors in the tested circuit.

2. Background of the Invention

The present invention generally relates to an automatic integrated circuit test apparatus provided with a means for protecting a circuit or device during test from being affected by extraneous electromagnetic signals such as alternating current (AC) interferences. This is achieved, in the present invention, by sealing all the avenues by which such signals can reach the circuit under test. This is especially achieved, in the present invention, by providing the tester with a unique handler that will, during the test, automatically encase the semiconductor circuit or device under test with a shield that attenuates or prevents extraneous electromagnetic signals that may cause test errors, from reaching the device being tested.

As is well known to the art, integrated circuits have a number of signal interface points or pins, herein after referred to as input/output pins, that are used to transfer data, in the form of electrical signals, into or out of the integrated circuits. During operation a select number of these pins are used to introduce the necessary control functions such as the circuit clocks, test modes, test control data, and etc. to the integrated circuit while the remaining signal interface pins are used to transfer data into and out of the data storage circuits contained in the integrated circuit.

At the present time, such AC defect testing requires the use of high frequency automated test equipment (ATE) that provides a tester contact for each signal interface pin on the integrated circuit, i.e., for both functional circuit pins and data storage pins. Often, under test conditions, the device being tested will function correctly in a direct current (DC) mode, that is, it will carry the proper current but, under AC test conditions, will exhibit false alternating current (AC) characteristics, e.g., the rise and fall times of signals will be altered such that the circuit appears to no longer meet its output specification. These false readings come about because extraneous electromagnetic signals from outside sources, such as adjacent testers, fluorescence lights, cell phones, nearby cell phone towers, radio security systems, and other modern electronic devices, can produce capacitively or inductively induce extraneous signals in the input/output pins of the device under test and thus create erroneous device outputs. These false readings result in either the scrapping of good devices or additional, more rigorous and/or extensive testing of the integrated circuit. In either case such false readings greatly increases the cost of such devices.

Furthermore as semiconductor chips or modules continue to increase in pin count and become faster they also become more sensitive to such extraneous electromagnetic signals. With every such an increase in sensitivity to stray electromagnetic signals testing of such devices has found to result in even more false test readings.

Even though the present high frequency, high pin count testers used in the industry are well designed, increasing sensitivity of the semiconductor devices or circuits to extraneous electromagnetic signals makes it increasingly difficult to provide automated test equipment that can speedily test the newer more complex integrated circuits without encountering the problems created by such extraneous electromagnetic signals.

With newer, higher storage capacity, and more sensitive integrated circuits the need of protecting them from such stray electromagnetic signals is even greater. None of the presently available automatic loading testers provide such protection.

Therefore, there are compelling economic reasons to provide a tester in which the integrated circuit being tested is protected from such extraneous electromagnetic signals during testing.

SUMMARY OF INVENTION

The present invention is thus directed to an apparatus and a method of testing semiconductor devices or modules in which extraneous electromagnetic radiation is either attenuated or prevented from reaching and affecting the device under test.

The present invention is further directed to an automated semiconductor test apparatus that cannot only automatically load and test an integrated circuit but one that will also automatically shield the device under test from being exposed to extraneous electromagnetic sources that can cause erroneous output signals in the tested device.

The present invention accomplishes this desirable result by providing, on the device handler, a shield that will automatically enclose and protect the device under test from stray electromagnetic signals when the device under test is inserted into the test socket.

In this way, the present invention achieves accurate testing of such integrated circuits while using commercially available testers.

Further the present invention reduces erroneous AC signals in tested circuits.

These objects, features and advantages of the present invention will be become further apparent to those skilled in the art from the following detailed description taken in conjunction with the accompanying drawings wherein:

DETAILED DESCRIPTION

Figure 1:
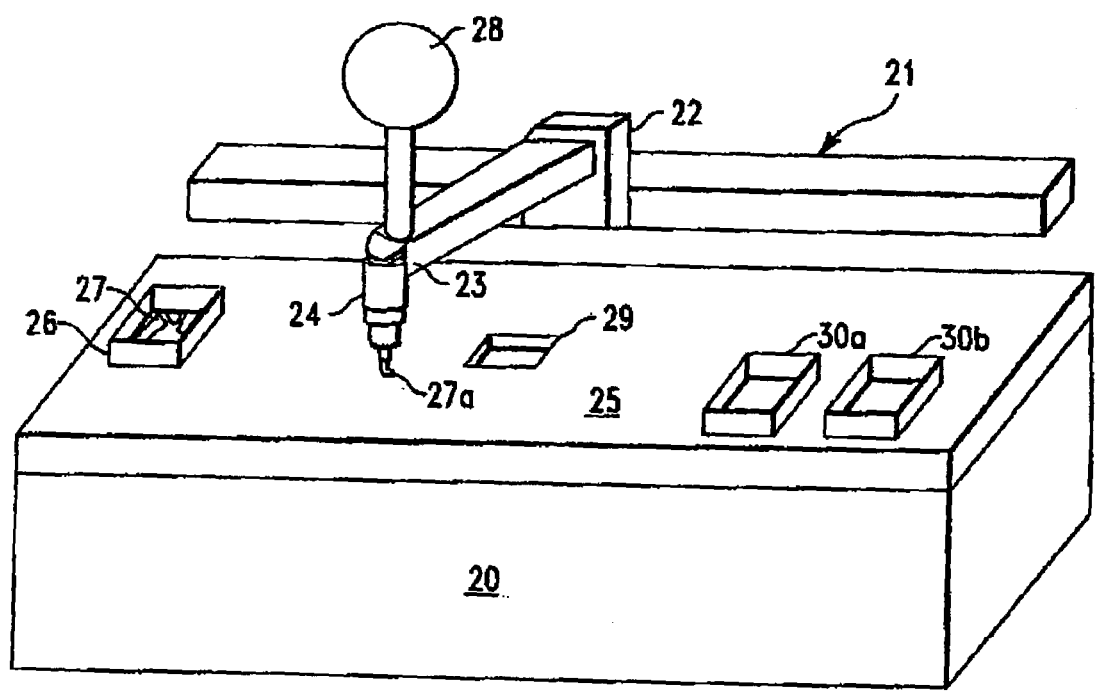
FIG. 1 is a schematic view of a prior art automatic tester.
Figure 2:
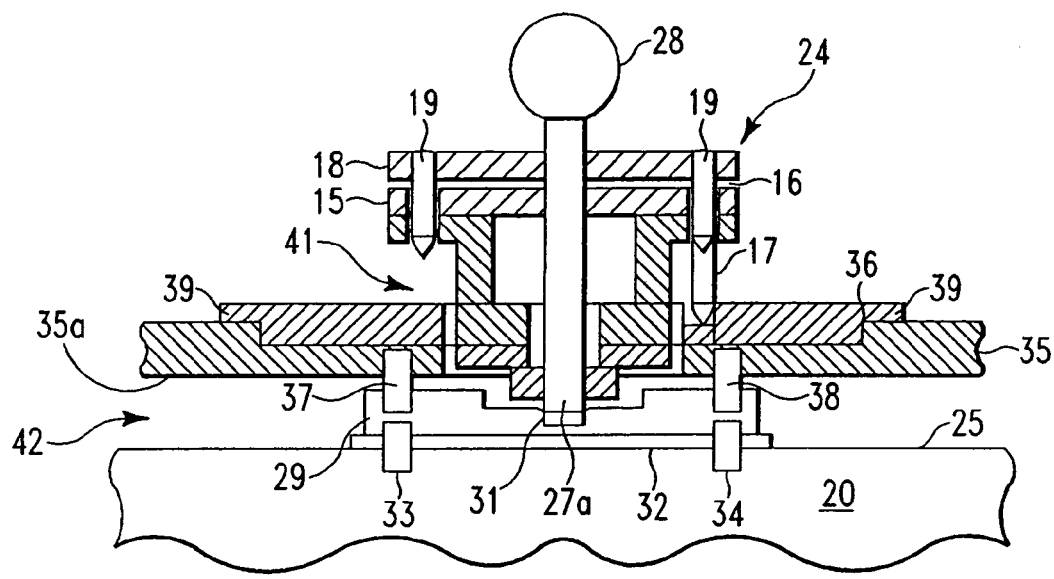
FIG. 2 is a detailed cross-sectional view of the pick up head of FIG. 1 holding a device in the test socket for testing taken along the line 2—2 of FIG. 8.
Figure 3:
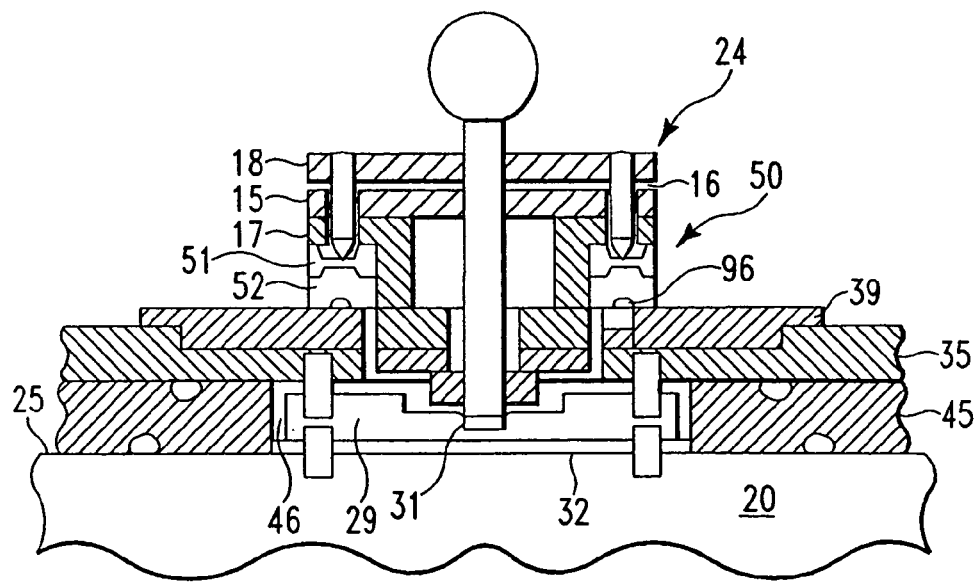
FIG. 3 is a cross-sectional view of the pick up head of the tester of FIG. 2, provided with the present invention installed thereto, as it holds a device in the test socket for testing.
Figure 4:
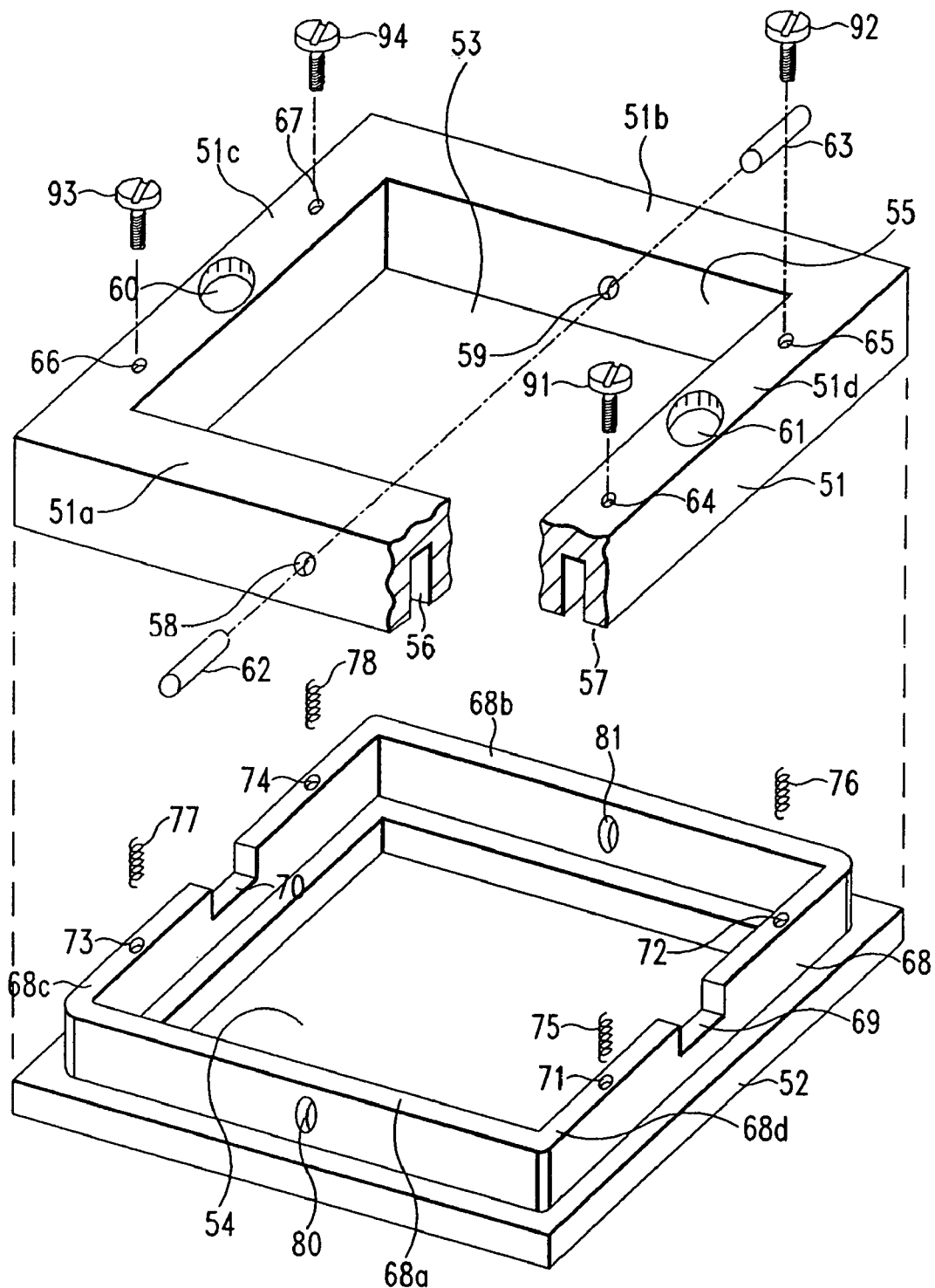
FIG. 4 is an exploded, partially sectioned view of the automatic enclosing shield of the present invention.
Figure 5:
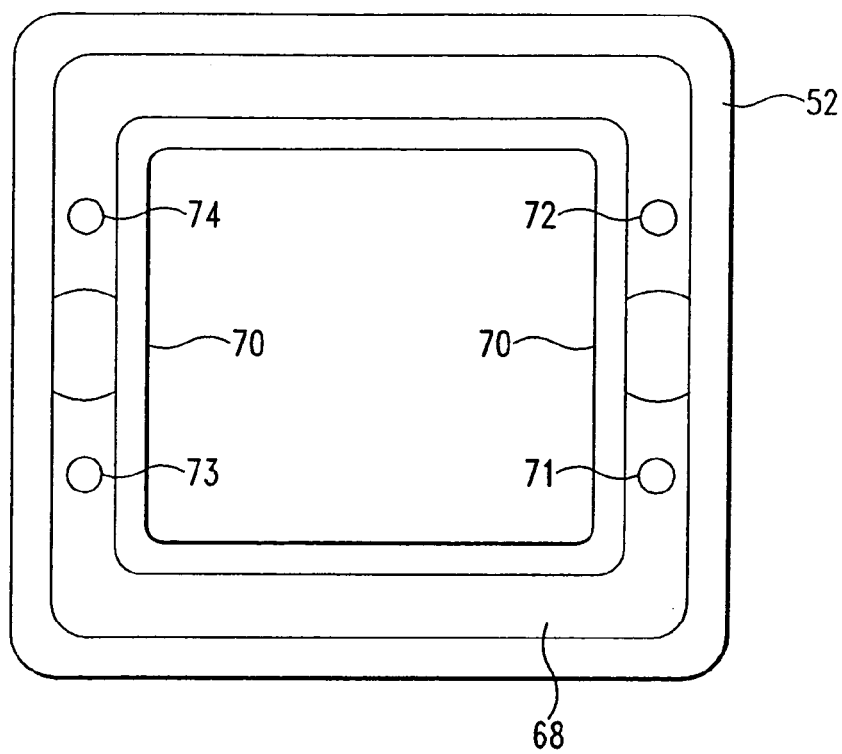
FIG. 5 is a top view of the bottom section of the automatic enclosing shield of the present invention.
Figure 6:
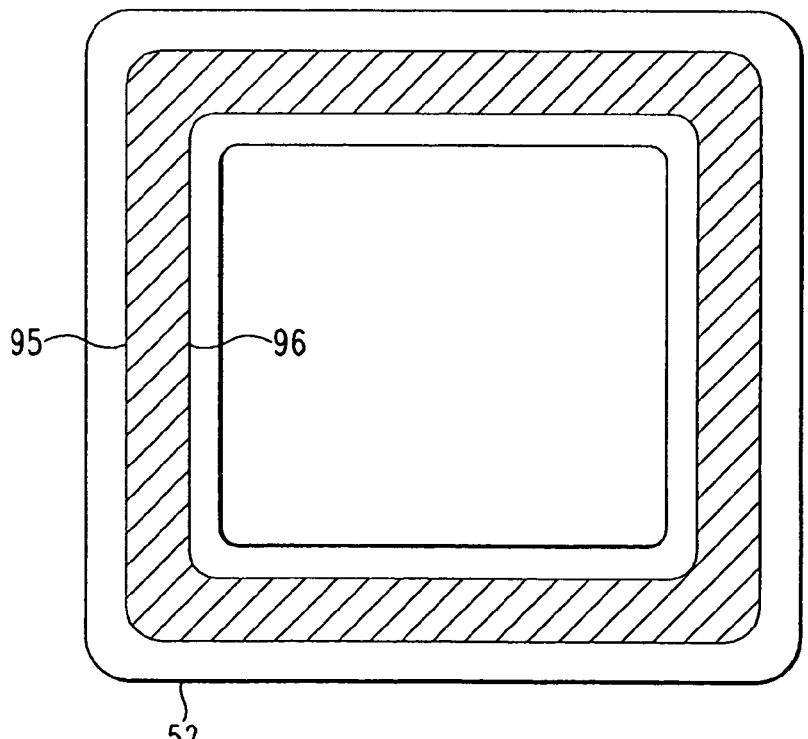
FIG. 6 is a bottom view of the bottom section of the automatic enclosing shield of the present invention.
Figure 7:
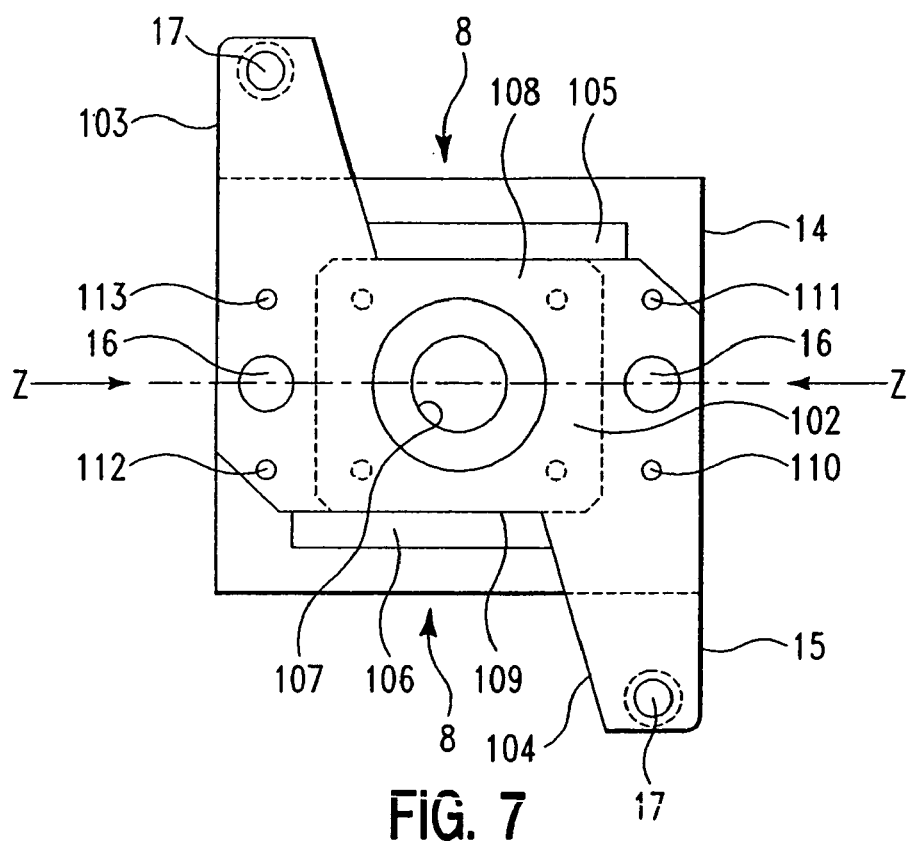
FIG. 7 is a top view of the floating block of the pickup head shown in FIG. 3.
Figure 9:
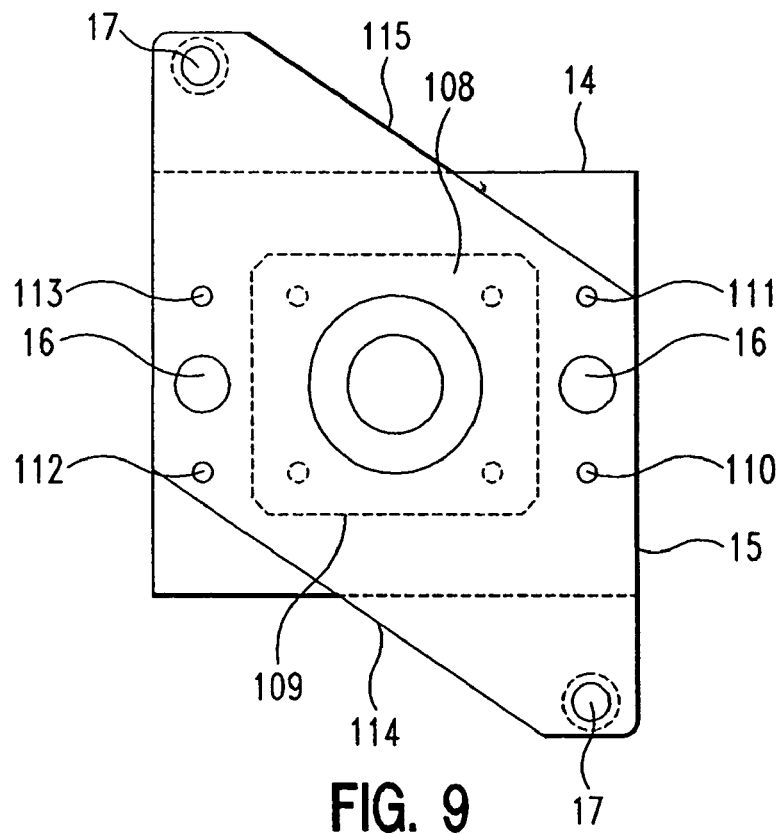
FIG. 9 is a top view of an improved floating block of the present invention.
Figure 8:
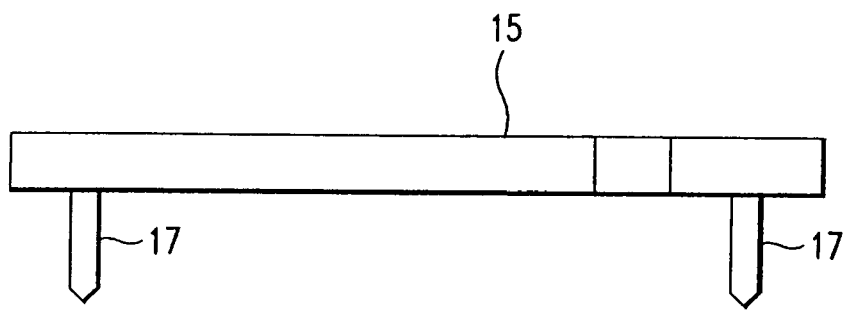
FIG. 8 is a side view of the floating block of the pickup head shown in FIG. 3.
Figure 10:
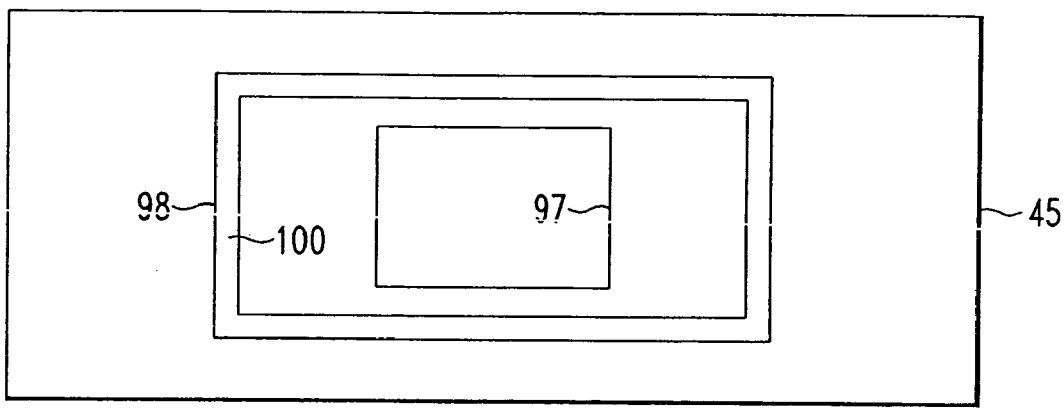
FIG. 10 is a top view of the mounting adapter plate of the present invention.
Figure 11:
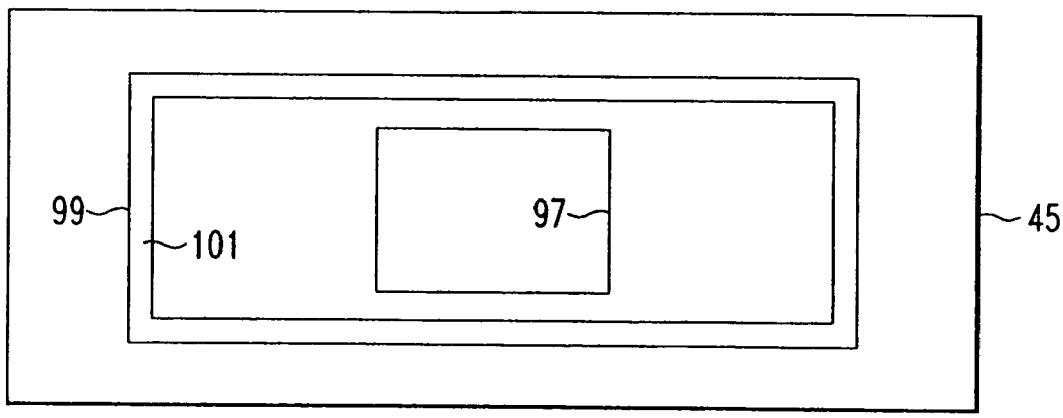
FIG. 11 is a bottom view of the mounting adapter plate of the present invention.

Referring now to FIGS. 1 through 6 the present invention will be described in detail. FIG. 1 is a schematic view of a prior art automatic tester; FIG. 2 is a detailed cross-sectional view of the pick up head of FIG. 1 holding a device in the test socket for testing taken along the line 2—2 of FIG. 7; FIG. 3 is a cross-sectional view of the pick up head of the tester of FIG. 2, provided with the present invention installed thereon, as it holds a device in the test socket for testing; FIG. 4 is an exploded, partially sectioned view of the automatic enclosing shield of the present invention; FIG. 5 is a top view of the bottom section of the automatic enclosing shield of the present invention; FIG. 6 is a bottom view of the bottom section of the automatic enclosing shield of the present invention; FIG. 7 is a top view of the floating block of the pickup head shown in FIG. 3; FIG. 8 is a side view of the floating block of the pickup head of FIG. 7 taken along the line 8—8; FIG. 9 is a top view of an improved floating block of the present invention; FIG. 10 is a top view of the mounting adapter plate of the present invention; and FIG. 11 is a bottom view of the mounting adapter plate of the present invention.

With reference now to the drawings and especially to FIG. 1, a typical automatic tester 20 of the prior art will be generally described. The tester 20 is basically a cabinet containing electrical circuitry (not shown) for applying selected electrical test signals to a semiconductor device in a test socket 29 mounted on the top surface 25 of the tester. The tester is also provided with an X-Y-Z drive mechanism 21 carrying a cantilevered elongated arm 22 which, in turn, carries on its cantilevered end 23 a circuit pick up head 24. The drive mechanism 21 is designed to drive the arm 22 and pickup head 24 across the upper surface 25 of the tester 20 to a tray 26 containing a plurality of devices 27 to be tested. Once the pickup head 24 is properly positioned over the tray 26, the head 24 is lowered until it contacts the surface of a selected device 27a in tray 26 at which time a vacuum system 28 is activated to hold the selected device 27a against the pick up head 24. With the selected device 27a securely held against the head 24, the mechanism 21 lifts the arm 22 and moves the selected device 27a over a test socket 29 provided on the upper surface 25 of the tester 20. The head 24 lowers the selected device 27a into the test socket 29 and holds the selected device 27a in the socket 29 and the test is initiated. When the test is complete, the device 27a is lifted from the test socket 29 and the head 24 then carries the tested device 27a to either output tray 30a or 30b depending on the result of the test. Output tray 30a could, for example, be designated for those devices that tested good and tray 30b for those devices that failed the test.

As shown in greater detail in FIGS. 2, 8, and 9, the test head 24 is comprised of a base 14 to which is affixed a floating block 15 carried by an alignment base 18. The alignment base 18 is provided with a pair of alignment pins 19 that pass through respective alignment holes 16 in the floating block 15. As shown more fully in FIGS. 7, 8, and 9, the floating block 15 is also provided with alignment pins 17 which align and position the head 24 with respect to the socket adapter plate 39 which is nested in a docking plate 35. The test socket 29 contains a recess 31 designed to couple the device under test to the internal circuitry of the tester 20 via a printed circuit card 32. Both the test socket 29 and the underlying printed circuit card 32 are correctly positioned on the upper surface of the tester 20 by vertical locating pins 33 and 34 positioned in and jutting out of the upper surface 25 of tester 20. It should be understood that each different type of circuit to be tested requires a unique test socket 29 and printed circuit card 32.

Over the top of the test socket 29 there is positioned the docking plate 35 which is held over and aligned to the socket 29 via pins 37 and 38. The socket adapter plate 39 is designed to nest in recess 36 in the docking plate 35. The socket adapter plate 39 is designed to accept and align the pickup head 24 such that the circuit 27a carried by the head 24 will be precisely aligned with and properly placed in the recess 31 in the test socket.

Since such testers are currently available in the marketplace and their use and construction is well known, further description of the construction or operation of such testers is not deemed necessary.

In these prior art testers, interfering signals, from various outside signals such as adjacent testers, fluorescence lights, cell phones, nearby cell phone towers, radio security systems, and other modern electronic devices were found to capacitively or inductively induce extraneous signals in the device under test. To eliminate these problems various solutions to control or prevent such signals from reaching the device being tested were attempted. For example, the use of a single Faraday cage built around the tester room was not satisfactory because it was found that adjacent testers in the room will often cause significant interference especially when testing similar product lines. Enclosing each individual tester in its own separate Faraday cage was then considered but the cost was found to be prohibitive. Additionally the use of such individual cages was found to be a significant hindrance to productivity because of the difficulties encountered during loading and unloading of the circuits as well as during tester setup, maintenance or repair.

It was thus necessary to find a simple, inexpensive way of screening the device while it was being tested from such extraneous interfering signals while avoiding the difficulties noted above. The present inventors undertook an extensive study of the problem and found that the primary avenues by which interfering signals reached the device under test were, as shown in FIG. 2, via a gap 41 around and between the pickup head 24 and the socket adapter 39 and docking plate 35 and via the space 42 between the lower surface 35a of the docking plate 35 and the upper surface 25 of the test socket 29 as shown in FIG. 2. The inventors first quantified the signal levels in the environment that caused interference and then after further study and experimentation determined that if the levels of the interfering signals were attenuated by between 40 dB(decibels) and 80 dB they would not interfere with the test. This level of attenuation was found sufficient to effectively eliminate interference not only from adjacent testers but also from other sources such as those above described.

The present invention, as shown in FIGS. 3, 4, 5, 6, 7, 8, 9 and 10 was then devised and was found to achieve this level of signal attenuation. More specifically, the present invention comprises a first attenuating or signal blocking shield in the form of a mounting adapter plate 45 fixedly positioned between the upper surface 25 of the tester 20 and the bottom of the docking plate 34 around the test socket 29 and a second signal blocking or attenuating automatically enclosing ring shield or screen 50 affixed to the pickup head 24. The first attenuating or signal blocking shield, i.e., the mounting adapter plate 45, once installed, remains fixedly in position all during the operation of the tester. The ring shield 50, however, is designed to automatically enclose or seal off the test socket 29, from extraneous electromagnetic signals, only when the pickup head 24 is holding a device 27*a* in the recess 31 of test socket 29. In this way the present invention blocks or attenuates any potentially interfering outside signals from affecting the device 27*a* being tested.

The present invention is thus simple, inexpensive and automatically shields the device under test without interfering with the test or hindering access to the product under test or to maintenance or repair of the tester.

Top and bottom views of the mounting adaptor plate 45 are shown respectively in FIGS. 10 and 11, In these FIGS. 10 and 11, the plate 45 has a central opening 97 there through that is large enough to surround the test socket 29 and is designed to enclose and seal off the region 42 existing between the lower surface of the docking plate 35 and the top surface 25 of tester 20 thus preventing undesirable signals from entering through the region 42. This plate 45 can be comprised of any suitable conductive material such as steel, copper, brass, aluminum, and etc. The plate 45 is preferably provided with a first circumferential groove 98 in its top surface around the opening 97 and a second circumferential groove 99 in its lower surface around the opening 97. Preferably the grooves 98 and 99 are offset from one another as shown in FIG. 3. These grooves are now filled with metallized coated elastomer rings 100 and 101 respectively. Such elastomers are currently commercially available and one such elastomer, suitable for use with the present invention, is sold as the 2400 General Metallized Fabric Coated Elastomer (part No. 2431-1011-0123) by the Tech-Etch Corporation located at 45 Aldrin Road, Plymouth Mass. These elastomer rings 100 and 101 are provided to assure that there is a tight conformal, attenuating seal between the docking plate 35 and the top surface 25 of the tester 20. If the surfaces of the docking plate 35, the tester 25, and the plate 45 are perfectly flat the gaskets may be eliminated. However to achieve such a surface flatness can prove to be a long and expensive task. and thus such gaskets are recommended.

The ring shield 50, of the present invention, is affixed, via the floating head 15, around the lower portion of the pickup head 24 such that when the device under test 27*a* is inserted into the test socket 29, the gap 22 is matically sealed by the ring shield 50 and extraneous external signals either are completely prevented from passing through the gap 41 or attenuated to a level below which they cannot adversely affect the circuit 27*a* being tested.

As shown in FIGS. 4, 5 and 6, the ring shield 50 basically comprises two intermeshing rings 51 and 52 each of which have a respective central opening 53 and 54 shaped and sized to closely conform to the exterior shape of the pickup head 24. In the present example the pickup head 24 is square and thus the central openings 53 and 54 in the rings are also square. It is to be understood that although here the pickup head 24 is shown, in the present example, as having a square exterior, its exterior could just as easily be round, elliptical, rectangular or polygonal. In such cases the central ring openings 53 and 54 would not be square as shown here but instead would be made to conform to the shape of the pickup head 24.

The present inventors further have found that the inner surface 55 of the upper ring section 51 should closely adhere to the exterior surface of the pickup head 24 and that any separation between the exterior surface of the pickup head 24 and the inner surface 55 of the upper ring section 51 should preferably be no more than 0.005 inches.

The rings 51 and 52 are preferably formed of aluminum electroplated with either a coating of nickel having a thickness of between 0.0003 inches and 0.001 inches or a coating of nickel of the same thickness with a flash of gold thereon. It should also be understood that other metal or metal alloys of sufficient structural strength such as copper, brass, steel or etc. can be used in lieu of aluminum and other metallic plating materials can be used.

The upper ring section 51 is also provided with a circumferential channel 56 on its lower face 57 and through horizontal holes 58 and 59 in opposing sides 51*a* and 51*b*. The through holes 58 and 59 are positioned so that they pass through the opposite sides 51*a* and 51*b* approximately halfway up the wall of the channel 34 and are adapted to accept pins 62 and 63 respectively. The other upper faces 51*c* and 51*d* of this upper ring section 51 are further respectively provided with through holes 60 and 61 that intersect the channel 44 and with tapped holes 64, 65, 66, and 67.

The lower ring section 52 is provided with a raised circumferential wall 68 that is designed to fit into and intermesh with the channel 56 in the upper ring section 51. Notches or slots 70 and 71 are provided on the top each opposite wall sections 68*c* and 68*d* such that the center of each respective notch is in line with the center of a respective one of the vertical through holes 60 and 61 in the upper ring section 51 when the wall 68, carried on the lower ring section 52, is inserted in the channel 56. The top surface of the walls 68*a* and 68*b* of the lower ring section 52 are further each respectively provided with respective vertical recesses or blind holes 71, 72, 73 and 74 that can, but need not, be aligned with the tapped vertical holes 64, 65, 66, and 67 when the lower and upper rings 51 and 52 are intermeshed. The lower surface of the lower ring section 52, as shown in FIG. 6 is provided with a circumferential groove 95 and a metallized fabric coated elastomer ring 96 is positioned therein.

Vertical slots 80 and 81 that pass horizontally through the respective walls 68*a* and 68*b* are provided such that they are aligned with the through horizontal holes 58 and 59 in the upper ring section 51 when the ring sections 51 and 52 are intermeshed or mated, i.e., when the wall 68 is positioned in the channel 56. When the rings sections 50 and 51 are so mated and pins 62 and 63 are inserted respectively through the horizontal through holes 58 and 59 in the upper ring 51 and through the aligned slots 80 and 81 slots in the walls of the lower ring 32, each spring 75, 76, 77, and 78 inserted into a respective one of the blind holes 71, 72, 73, and 74 must be of a length such that they will be compressed between the ring sections so as to maintain the ring sections apart a distance established by the length of the slots 80 and 81 and the diameter of the pins 62 and 63.

Once the sections 51 and 52 are assembled, the ring shield 50 is placed around the pickup head 24 and affixed to the floating head block 15 by screws 90, 91, 92, and 93 passed through respective holes 110, 111, 112, and 113 in the floating head block 15 and threaded into the tapped holes 64, 65, 66, and 67 in the upper ring section 51 of the ring shield 50. This secures the ring shield 50 around the pickup head 24.

The elastomer ring 96 located in the groove 95 in the lower face of the lower ring section 52 is once again formed of the 2400 General Metallized Fabric Coated Elastomer sold by the Tech-Etch Corporation and is provided to assure that there is a tight conformal, attenuating seal between the ring shield 50 and the upper surface of the socket adapter 39.

When a pickup head having such a ring shield 50, fitted thereon, introduces a device to be tested into the recess 39 in the test socket 29, the lower ring section is held tight against the upper surface of the socket adapter by the springs 75, 76, 77, and 78 in the blind holes or recesses 71, 72, 73, and 74 and the elastomer ring 95 is compressed to form a tight conductive seal between the ring shiled 50 and the socket adapter 39. Further The wall 68 on the lower section being in the channel 56 in the upper ring section acts as a baffle and electromagnetic signals cannot pass there through. Thus the intermeshed rings 51 and 52 and the metallized fabric elastomer ring assuring that there is a tight attenuating seal across the gap 22 around the test head and the device under test such that extraneous electromagnetic signals can no longer reach the device under test via the gap 22.

FIG. 7 is a top view of the floating head block 15 provided with the tester by the manufacturer. This floating head block 15 has a central opening 107 through which the vacuum line is introduced into the head. This central opening 107 is bracketed by the through holes 16 through which the alignment base pins 19 extend, as shown in FIG. 2. This floating head block 15 has a central section 102 generally in the form of a square from which arms 103 and 104 extend. At the end of each arm 103 and 104 there is provided the vertical alignment pins 17 that descend into appropriate openings in the socket adapter plate when the pickup head inserts a device 27a into the recess 39 in the test socket 29 as shown in FIG. 2. With this manufacturers supplied floating head block 15 opposing sides 108 and 109 of the central region 102 align with the underlying edges of the pickup head. This provides a possibility that a gap can exist through which undesired signals can penetrate to the chip under test. To block or attenuate and such signals ribbons of metallized fabric coated elastomers 105 and 106 are placed along the sides 107 and 108 of the central square region 102 as shown in FIG. 7.

An alternate solution is to redesign the floating head block 15 so the central section 102 has trapezoidal sides 114 and 115 rather than square sides as shown in FIG. 9. In this way the edges 108 and 109 of the pickup head are covered by the floating head block 15 and the unwanted electromagnet signals are attenuated or prevented from passing down beside the pickup head.

Other alternate solutions will now become obvious to one skilled in the art after review of the present invention. For example a circumferential shield could be mounted directly on the floating block or on the fixture/socket adapter plate such that the pickup head would be received therein. It is also possible by careful machining of the pickup head, shield, floating block, the fixture/socket adapter plate and other associated parts that all metal mating surfaces between the associated elements of system could be made smooth enough that the compressive metallized polymers gaskets could be eliminated.

Other adaptations such as mounting the compressive metallized polymer on the inside of the shield rings 51 or 52 or on the socket adapter plate instead of the shield assembly or even forming the floating block plate of a metallized polymer may also be possible.

This completes the description of the preferred embodiment of the invention. Since changes may be made in the above construction without departing from the scope of the invention described herein, it is intended that all the matter contained in the above description or shown in the accompanying drawings shall be interpreted in as illustrative and not in a limiting sense. Thus other alternatives and modifications will now become apparent to those skilled in the art without departing from the spirit and scope of the invention as set forth in the following claims.

What is claimed is:

1. A semiconductor testing apparatus comprising:
   a test socket for holding a semiconductor to be tested;
   a pickup head for positioning and holding a semiconductor device to be tested in said test socket;
   means for applying selected electrical signals to a semiconductor device while said pickup device is holding said device in said test socket; and
   a signal shield affixed around said pickup head for automatically attenuating external signals to a level whereby external signals will not interfere with said selected signals being applied to said semiconductor device while said pickup head is holding said device in said test socket;
   wherein said signal shield is comprised of an upper ring having a channel in its lower surface; and
   a lower ring provided with a raised wall thereon;
   said wall being on said lower ring being configured to conform to said channel in said upper ring and intermesh therewith.

2. A semiconductor test apparatus comprising;
   a cabinet containing electrical circuitry for applying selected electrical test signals to a semiconductor device;
   a top surface on said cabinet;
   a test socket, coupled to said circuitry, mounted on said top surface of the cabinet;
   a docking plate positioned above said test socket;
   a socket adaptor plate nested in and supported by said docking plate;
   an alignment base carrying a floating head block secured to a circuit pickup head designed to insert a semiconductor device into said test socket for testing:
   a first signal attenuating shield in the form of a mounting adapter plate fixedly positioned between the top surface of the tester and the docking plate around the test socket; and
   a second signal attenuating shield affixed to the pickup head by said floating head block for automatically enclosing the test socket when the pickup head is holding a device in the test socket and thereby attenuating any extraneous electromagnetic signals to a level at which they will not adversely affect the device in said test socket.

3. The apparatus of claim 2 wherein said mounting adaptor plate has a first surface and a second surface and a central opening there though;
   said first surface contacting the lower surface of the docking plate and the second surface contacting the top surface of the tester.

4. The apparatus of claim 3 wherein said mounting adaptor plate is formed of a conductive material and is provided with a first circumferential groove in its first surface around said central opening and a second circumferential groove in its second surface around said central opening.

5. The apparatus of claim 4 wherein said first groove is offset from said second groove and each groove is now filled with a respective metallized coated elastomer ring to assure that there is a tight conformal, attenuating seal between the docking plate and the top surface of the tester.

6. The apparatus of claim 2 wherein said second shield is affixed, by the floating head device around said pick up head.

7. The apparatus of claim 2 wherein said second shield automatically seals off the test socket from extraneous electromagnetic signals when the pickup head is holding a device to be tested in the recess of test socket.

8. The apparatus of claim 2 wherein said second is affixed by a floating head black around the lower portion of the pickup head.

9. The apparatus of claim 2 wherein said second shield comprises upper and lower intermeshing rings having respective central openings conforming to the exterior shape of the pickup head the inner surface of central opening of said upper ring section being separated by less than 0.005 inches from the exterior surface of the pickup head.

10. The apparatus of claim 9 wherein said upper and lower intermeshing rings are preferably formed of aluminum electroplated with a coating of nickel having a thickness of between 0.0003 inches and 0.001 inches.

11. The apparatus of claim 9 wherein said upper ring section has opposing vertical side walls, an upper horizontal face and a lower horizontal face;
- a circumferential channel on said lower face;
- a through horizontal hole in said opposing side walls, each horizontal hole being adapted to accept a respective pin;
- said upper face on each of said opposing walls having a through vertical hole that intersect the channel on its lower face and with a pair tapped holes adjacent said vertical channel intersecting hole.

12. The apparatus of claim 11 wherein said lower ring section has a raised circumferential wall designed to fit into and intermesh with the channel in said upper ring section;
- notches on the top of opposite sections of said circumferential wall, each notch being in line with the center of a respective one of the vertical through holes in the upper ring section when the circumferential wall is inserted in the channel is said upper ring section
- the top surface of selected sections of said circumferential wall being provided with respective vertical blind holes.

13. The apparatus of claim 12 wherein said lower surface of the lower ring section is provided with a circumferential groove 95 having a metallized fabric coated elastomer ring is positioned therein.

14. The apparatus of claim 13 opposing sections of said circumferential wall is provided with vertical slots that pass horizontally through the respective opposing walls and are aligned with the through horizontal holes in opposing walls in said upper ring section when the upper and lower ring sections intermeshed by introducing the circumferential wall into the channel of the upper ring section.

15. The apparatus of claim 14 wherein said lower ring section has a circumferential groove in its lower face and said groove has an elastomer ring located therein.

* * * * *